(12) United States Patent
Lee

(10) Patent No.: US 11,195,581 B1
(45) Date of Patent: Dec. 7, 2021

(54) MEMORY CELL, MEMORY ARRAY AND OPERATION METHOD USING THE SAME

(71) Applicant: MACRONIX INTERNATIONAL CO., LTD., Hsinchu (TW)

(72) Inventor: Ming-Hsiu Lee, Hsinchu (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 16/935,349

(22) Filed: Jul. 22, 2020

(51) Int. Cl.
*G11C 8/00* (2006.01)
*G11C 5/02* (2006.01)
*G11C 5/06* (2006.01)
*G11C 13/00* (2006.01)
*G11C 11/56* (2006.01)

(52) U.S. Cl.
CPC ............ *G11C 13/004* (2013.01); *G11C 5/063* (2013.01); *G11C 11/5621* (2013.01); *G11C 13/0023* (2013.01); *G11C 13/0038* (2013.01); *G11C 13/0064* (2013.01); *G11C 13/0069* (2013.01)

(58) Field of Classification Search
CPC ... G11C 13/004; G11C 5/063; G11C 11/5621; G11C 13/0023; G11C 13/0038; G11C 13/0064; G11C 13/0069
USPC .......................................................... 365/148
See application file for complete search history.

(56) References Cited

U.S. PATENT DOCUMENTS

| | | | | |
|---|---|---|---|---|
| 5,412,602 A * | 5/1995 | Yero | ...................... | G11C 16/30 365/189.09 |
| 7,274,587 B2 * | 9/2007 | Yasuda | .................. | G11C 11/16 365/148 |
| 8,331,130 B2 * | 12/2012 | Yasuda | ................ | G11C 13/003 365/148 |
| 9,230,641 B2 * | 1/2016 | Sekar | ................... | G11C 13/004 |
| 9,589,636 B1 * | 3/2017 | Bhavnagarwala | ... | G11C 13/003 |
| 9,837,150 B2 * | 12/2017 | Jeong | .................. | G11C 13/004 |

OTHER PUBLICATIONS

Ly, et al.: Novel 1T2R1T RRAM-based Ternary Content Addressable Memory for Large Scale Pattern Recognition; © 2019 IEEE; pp. 35.5.1-35.5.4.

Lastras-Montaño, et al.: "Resistive random-access memory based on ratioed memristors"; Nature Electronics; vol. 1: Aug. 2018; pp. 466-472; www.nature.com/natureelectronics.

Linn, et al.: "Complementary resistive switches for passive nanocrossbar memories"; Nature Materials; vol. 9; May 2010; www.nature.com/naturematerials; pp. 403-406.

* cited by examiner

*Primary Examiner* — Ly D Pham
(74) *Attorney, Agent, or Firm* — McClure, Qualey & Rodack, LLP

(57) ABSTRACT

A memory cell includes: a transistor having a control terminal coupled to a first node; a first terminal coupled to a first signal line; and a second terminal coupled to a second signal line; a first resistance element, having a first terminal coupled to the first node and a second terminal coupled to a second node; and a second resistance element, having a first terminal coupled to the first node and a second terminal coupled to a third node.

13 Claims, 10 Drawing Sheets

MEMORY CELL, MEMORY ARRAY AND OPERATION METHOD USING THE SAME

TECHNICAL FIELD

The disclosure relates in general to a memory cell, a memory array and an operation method using the same.

BACKGROUND

The memory state of a memory cell is represented by the cell's physical parameters, such as resistance, capacitance and etc. However, the value of the physical parameters used to represent the memory state of the memory cell is generally not fixed at the designated level, but widely distributed in some ranges due to limitations such as the programming accuracy, thermal noise, etc.

If the value of the physical parameters of the memory cell has large variation, then the output current of the memory cell may also have wide distribution, which results reliability or accuracy problems.

Further, in tradition, the impedance state (high impedance state presenting logic 1 or low impedance state presenting logic 0) of the memory cell may be determined based on the readout current of the memory cell. However, if the difference between the readout current reading from logic 0 cell and the readout current reading from logic 1 cell is not significant, then there may have a read error.

SUMMARY

According to one embodiment, provided is a memory cell including: a transistor having a control terminal coupled to a first node; a first terminal coupled to a first signal line; and a second terminal coupled to a second signal line; a first resistance element; having a first terminal coupled to the first node and a second terminal coupled to a second node; and a second resistance element, having a first terminal coupled to the first node and a second terminal coupled to a third node.

According to another embodiment, provided is a memory array comprising: a plurality of memory cells; a plurality of first signal lines; a plurality of second signal lines; a plurality of third signal lines; and a plurality of fourth signal lines. The memory cells are coupled to the first signal lines, the second signal lines, the third signal lines and the fourth signal lines. Each of the memory cells includes: a transistor having a control terminal coupled to a first node; a first terminal coupled to one of the first signal lines; and a second terminal coupled to one of the second signal lines; a first resistance element; having a first terminal coupled to the first node and a second terminal coupled to a second node; and a second resistance element, having a first terminal coupled to the first node and a second terminal coupled to a third node.

According to an alternative embodiment, provided is an operation method for a memory cell, the operation method including: in programming operations, flowing a programming current between the second node and the third node to program one of the first resistance element and the second resistance element at a first impedance state and to program the other of the first resistance element and the second resistance element at a second impedance state; and in reading operations, applying a voltage across the first resistance element and the second resistance element to flow a read current on the first resistance element and the second resistance element, wherein a first node voltage of the first node is determined based on a resistance ratio of the first resistance element and the second resistance element.

Figure 1:
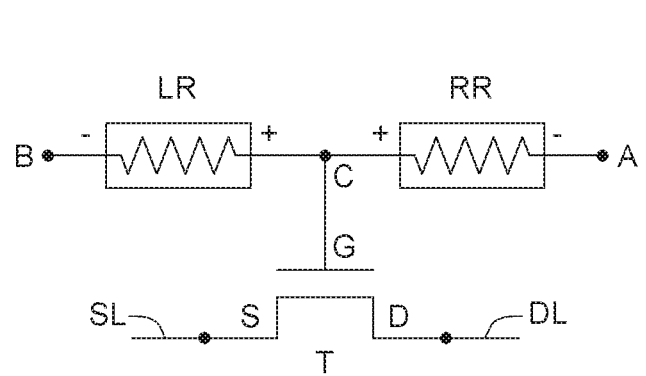
FIG. 1 shows a structure diagram for a memory cell according to one embodiment of the application.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DESCRIPTION OF THE EMBODIMENTS

Technical terms of the disclosure are based on general definition in the technical field of the disclosure. If the disclosure describes or explains one or some terms, definition of the terms is based on the description or explanation of the disclosure. Each of the disclosed embodiments has one or more technical features. In possible implementation, one skilled person in the art would selectively implement part or all technical features of any embodiment of the disclosure or selectively combine part or all technical features of the embodiments of the disclosure.

FIG. 1 shows a structure diagram for a memory cell according to one embodiment of the application. As shown in FIG. 1, the memory cell according to one embodiment of the application includes a transistor T and two resistance elements RR and LR. The symbol RR refers to the first resistance element while the symbol LR refers to the second resistance element.

The transistor T includes: a gate (a control terminal) G, coupled to the node C; a drain (a first terminal) D coupled to the drain line DL (a first signal line); and a source (a second terminal) S coupled to the source line SL (a second signal line).

The first resistance element RR includes: a first terminal (a positive terminal) coupled to the node C; and a second terminal (a negative terminal) coupled to the node A.

The second resistance element LR includes: a first terminal (a positive terminal) coupled to the node C; and a second terminal (a negative terminal) coupled to the node B.

In the technical field of the application, the positive terminal and the negative terminal of the resistance element represents the polarity of the resistance element, which is used to understand the programming direction.

The first resistance element RR and the second resistance element LR are head-to-head series connected because the positive terminals of the two resistance elements RR and LR are coupled to each other at the node C. In programming, the programming current flows between the node A and the node B. Because The first resistance element RR and the second resistance element LR are head-to-head series connected, one of the resistance elements RR and LR is programmed to a first impedance state (for example but not limited by, a high impedance state) while the other one is programmed to a second impedance state (for example but not limited by, a low impedance state), depending on the direction of the programming current flow.

In programming logic 0, the node A is applied by a first programming voltage VAP0 (for example but not limited by, 3V) and the node B is applied by a second programming voltage VBP0 (for example but not limited by, 0V). The programming current flows from the node A to the node B because the node voltage VA is higher than the node voltage VB, As for the first resistance element RR, the programming current flows from the second terminal (the negative terminal) to the first terminal (the positive terminal) and thus, the first resistance element RR is at the first impedance state (a high impedance state). The programming current does not flow into the gate G and thus all the programming current flows to the second resistance element LR. As for the second resistance element LR, the programming current flows from the first terminal (the positive terminal) to the second terminal (the negative terminal) and thus, the second resistance element LR is at the second impedance state (a low impedance state). In programming logic 0, the drain and the source are floated and thus the drain line DL and the source line SL are at high impedance state.

In programming logic 1, the node A is applied by a third programming voltage VAP1 (for example but not limited by, 0V) and the node B is applied by a fourth programming voltage VBP1 (for example but not limited by, 3V), The programming current flows from the node B to the node A because the node voltage of the node B is higher than the node voltage of the node A. As for the second resistance element LR, the programming current flows from the second terminal (the negative terminal) to the first terminal (the positive terminal) and thus, the second resistance element LR is at the first impedance state (a high impedance state). The programming current does not flow into the gate G and thus all the programming current flows to the first resistance element RR. As for the first resistance element RR, the programming current flows from the first terminal (the positive terminal) to the second terminal (the negative terminal) and thus, the first resistance element RR is at the second impedance state (a low impedance state). In programming logic 1, the drain and the source are floated and thus the drain line DL and the source line SL are at high impedance state.

In reading operations, a bias voltage is applied across the first resistance element RR and the second resistance element LR and thus, a read current is formed to flow through the first resistance element RR and the second resistance element LR. Because one of the first resistance element RR and the second resistance element LR is at the high impedance state, thus the reading current is small. Further, the node voltage VC is determined based on a resistance ratio of the first resistance element RR and the second resistance element LR.

In reading operations, the node A is applied by a first read voltage VA (which is described later) and the node B is applied by a second read voltage VB (which is described later), wherein a voltage VCHECK is defined as: VCHECK=VA−VB. Because one of the first resistance element RR and the second resistance element LR is at the high impedance state, the reading current is small. Further, the node voltage VC is determined based on a resistance ratio of the first resistance element RR and the second resistance element LR.

In details, the node voltage VC is expressed as: VC= [VCHECK*(Rleft)/(Rleft*Rright)]+VB, wherein Rright and Rleft refer to the resistance values of the first resistance element RR and the second resistance element LR.

In reading operations, the drain line DL is applied by a drain voltage VDL (for example but not limited by, 0.2V) while the source line SL is applied by a source voltage VSL (for example but not limited by, 0V). A read bias voltage VDS (VDS=VDL−VSL) is applied across the drain line DL and the source line SL of the transistor T of the selected memory cell. The current READ flowing through the transistor T is determined based on the node voltage VC. When the node voltage VC is higher the threshold voltage VTH of the transistor T, the transistor T is conducted and the read current IREAD is higher. When the node voltage VC is lower the threshold voltage VTH of the transistor T, the transistor T is disconnected and the read current IREAD is very small.

Figure 2:
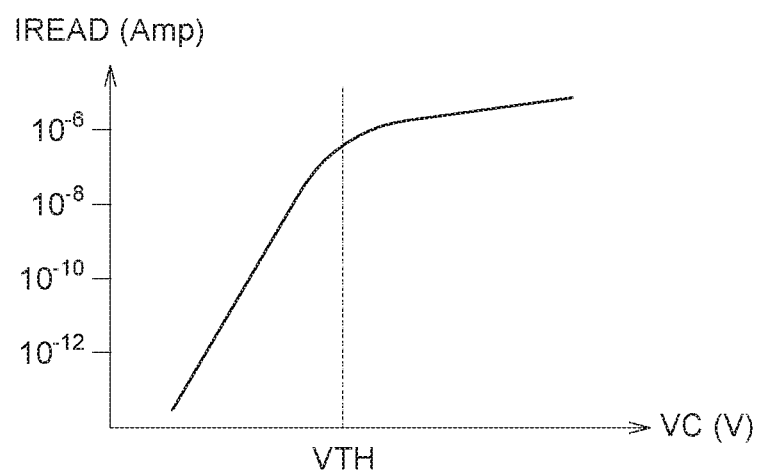
FIG. 2 shows a curve diagram for the node voltage VC and the read current IREAD according to one embodiment of the application.

FIG. 2 shows a curve diagram for the node voltage VC and the read current IREAD according to one embodiment of the application. As shown in FIG. 2, when the node voltage VC is at the subthreshold region (i.e. the node voltage VC is close to or lower than the threshold voltage VTH of the transistor T), the read current READ is highly sensitive to the node voltage VC.

The following table shows the programming voltages and the read voltages according to one embodiment of the application.

|  | Program Logic 0 | Program Logic 1 | Read |
| --- | --- | --- | --- |
| Node A | VAP0 | VAP1 | VA |
| Node B | VBP0 | VBP1 | VB |
| DL | High Z (floating) | High Z (floating) | VDL |
| SL | High Z (floating) | High Z (floating) | VSL |
| Rleft | Low Resistance | High Resistance | N/A |
| Rright | High Resistance | Low Resistance | N/A |

Data output of the memory cell 100 is the transistor current. Because of the steep subthreshold swing of the transistor, the memory cell 100 according to one embodiment of the application provides improved read current distribution, even when the node voltage VC has significant variations on both memory state 0 (i.e, the memory cell 100 storing logic 0) and memory state 1 (i.e. the memory cell 100 storing logic 1). This is because the node voltage VC affects the read current IREAD.

Figure 3:
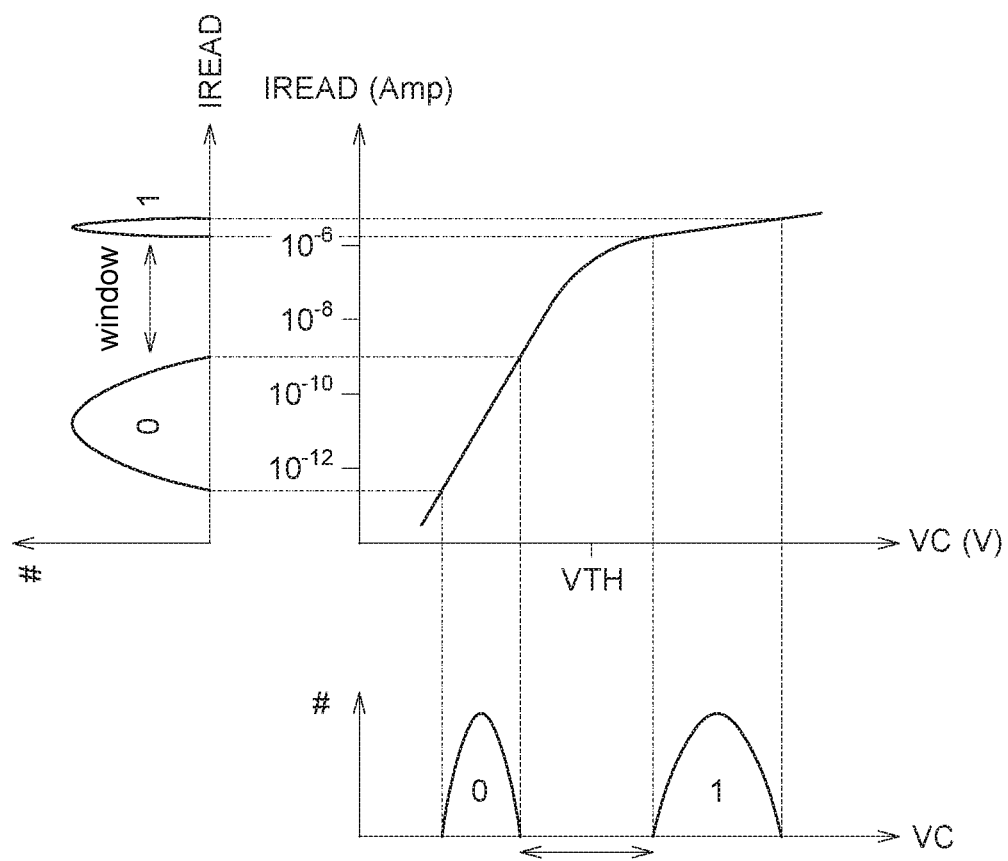
FIG. 3 shows read current distribution for reading memory state 0 and memory state 1 according to one embodiment of the application.

FIG. 3 shows read current distribution for reading memory state 0 and memory state 1 according to one embodiment of the application. As shown in FIG. 3, the read current IREAD in reading the memory state 1 cell is about $10^{-6}$ (A) while the read current IREAD in reading the memory state 0 cell is smaller than $10^{-9}$ (A), which results in significant difference (about 1000 times), In FIG. 3, the node voltage VC of the memory state 1 cell is about double to the node voltage VC of the memory state 0 cell. Therefore, as shown in FIG. 3, even if the node voltage VC of the memory cell has large variation, the read current IREAD is distinguishable between logic 1 and logic 0 (i.e. the window between logic 1 and logic 0 is large enough). In reading the memory cell according to one embodiment of the application, it is easier to correctly judge read logic 1 or logic 0.

Various setting conditions of the node voltage VC of the memory cell are described. As discussed above, in reading, the node voltage VC is controlled by the node voltage VA and the node voltage VB, and thus the output current (i.e. the read current IREAD) of the transistor is at different regions (the linear region or the logarithmic scale region).

Figure 4A:
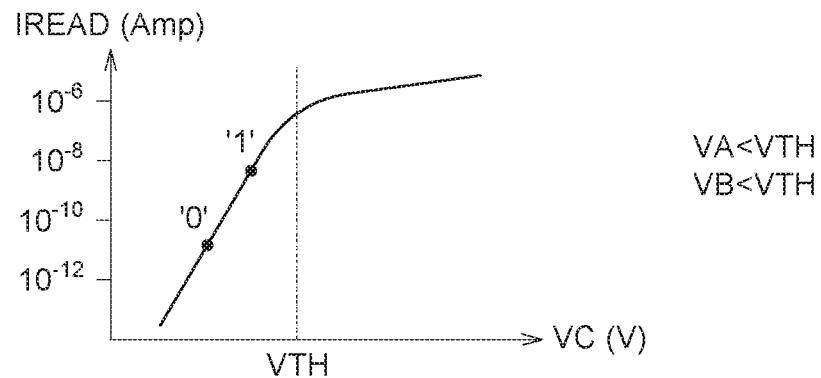
FIG. 4A to FIG. 4C show curve diagrams for the node voltage VC and the read current IREAD according to one embodiment of the application.
Figure 4B:
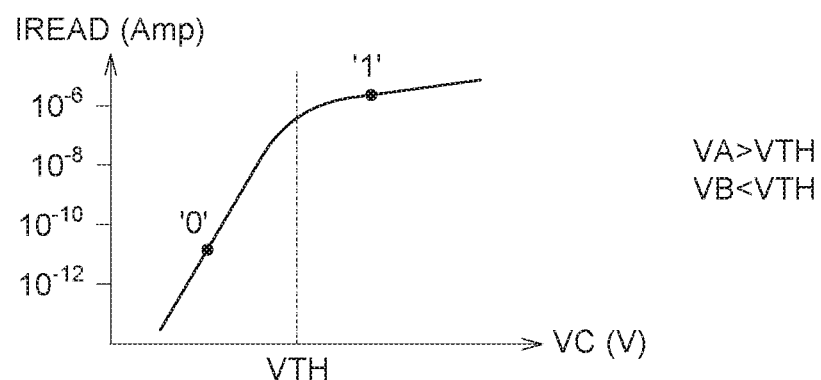
Figure 4C:
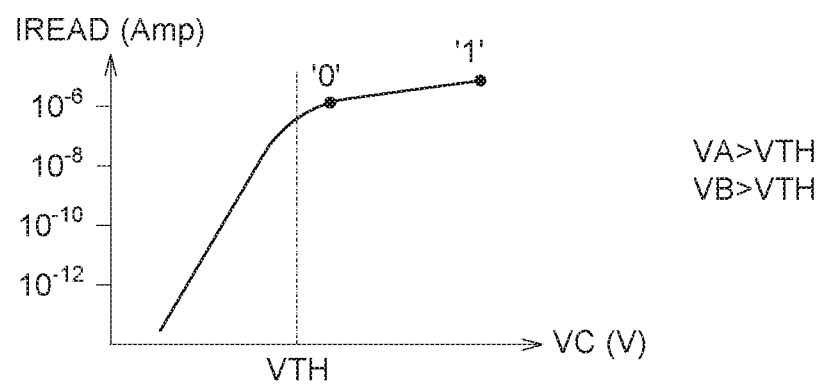

FIG. 4A to FIG. 4C show curve diagrams for the node voltage VC and the read current IREAD according to one embodiment of the application. In FIG. 4A, the node voltage VA and the node voltage VB are both lower than the threshold voltage VTH, and thus the node voltage VC is also lower than the threshold voltage VTH. The read current distribution of the memory state 0 and the read current distribution of the memory state 1 are both in the logarithmic scale region. There is significant difference between the read current of the memory state 0 and the read current of the memory state 1. It is easier to correctly determine to read out logic 0 or logic 1.

In FIG. 4B, the node voltage VA is higher than the threshold voltage VTH while the node voltage VB is lower than the threshold voltage VTH. Thus the node voltage VC is distributed on two sides of the threshold voltage VTH. The read current distribution of the memory state 0 is in the logarithmic scale region and the read current distribution of the memory state 1 is in the linear region. There is significant difference between the read current of the memory state 0 and the read current of the memory state 1. It is easy to determine whether the logic 0 or logic 1 is read.

In FIG. 4C, the node voltage VA and the node voltage VB are both higher than the threshold voltage VTH. Thus the node voltage VC is higher than the threshold voltage VTH. The read current distribution of the memory state 0 and the read current distribution of the memory state 1 are both in the linear region. There is significant difference between the read current of the memory state 0 and the read current of the memory state 1. It is easy to determine whether the logic 0 or logic 1 is read.

Figure 5:
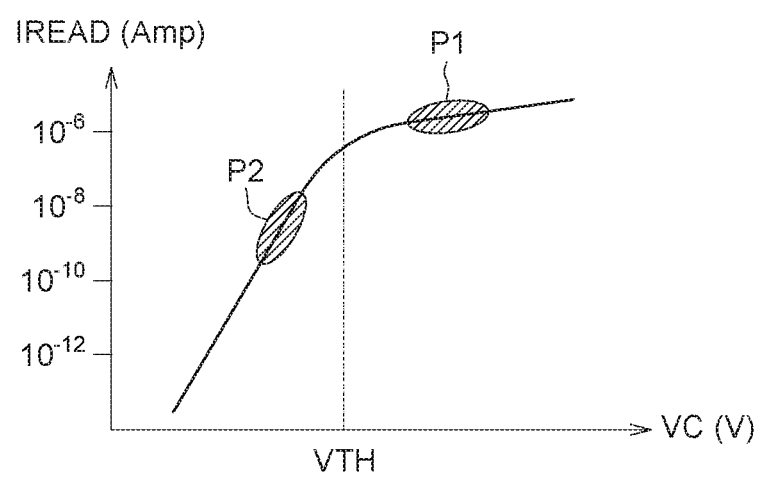
FIG. 5 shows a curve diagram for the node voltage VC and the read current IREAD when the memory cell according to one embodiment of the application is used to implement a true random number generator (TRNG).

Further, the memory cell according to one embodiment of the application is suitable to implement TRNG (true random number generator). In implementing TRNG, the first resistance element RR and the second resistance element LR are designed to have similar resistance values, and the node voltage VA is higher than the threshold voltage VTH while the node voltage VB is lower than the threshold voltage VTH. If there is noise fluctuation in the resistance values of the first resistance element RR and the second resistance element LR, the node voltage VC is fluctuated near the threshold voltage VTH. Thus, the transistor T is randomly jiggled between conduction and non-conduction, and thus the output current IREAD (the read current) of the transistor T is also jiggled between conduction and non-conduction value to generate a random number, FIG. 5 shows a curve diagram for the node voltage VC and the read current IREAD when the memory cell according to one embodiment of the application is used to implement a true random number generator (TRNG). As shown in FIG. 5, P1 refers to variation range of the node VC in memory state 1 while P2 refers to variation range of the node VC in memory state 0. The variation is caused by the noise fluctuation in the resistance values of the first resistance element RR and the second resistance element LR. In this case, the difference (i.e. an output memory window) between the read current IREAD in the memory state 1 and in the memory state 0 is significant. Thus, it is easy to determine whether the logic 1 or logic 0 is read.

In other possible embodiment of the application, the memory cell is also suitable to implement Physically Unclonable Function (PUF). PUF for every chip is unique, fixed and unpredictable, which can server as the finger print of the chip for security application. To implement PUF function, the first resistance element RR and the second resistance element LR are staying at the initial level (having unknown resistance values). Such initial level comes from the nature variation of the process and cannot be controlled manually. As discussed above, the node voltage VC (i.e. the control voltage of the transistor T) is related to the resistance value of the first resistance element RR and the second resistance element LR. Because the resistance values of the first resistance element RR and the second resistance element LR are unknown, whether the memory cell stores logic 1 or logic 0 is unknown. If there are eight memory cells for storing the private key, then the memory status of the eight memory cells are unpredictable. Thus, the eight memory cells may be used as the finger print of the chip for security protection.

Figure 6:
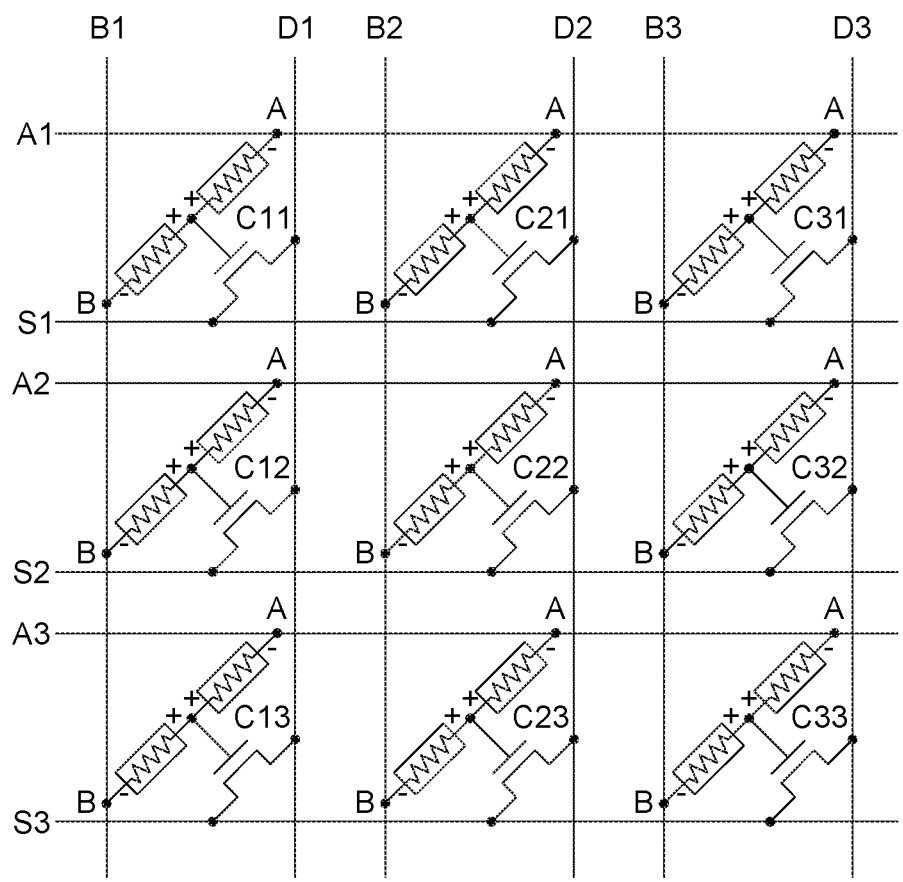
FIG. 6 shows a structure diagram for a memory array according to one embodiment of the application.

FIG. 6 shows a structure diagram for a memory array according to one embodiment of the application. As shown in FIG. 6, the memory array 600 includes a plurality of memory cells C11-C33, a plurality of drain lines (i.e. a plurality of first signal lines) D1-D3, a plurality of source lines (i.e. a plurality of second signal lines) S1-S3, a plurality of third signal lines A1-A3 and a plurality of fourth signal lines B1-B3. The memory cells C11-C33 are coupled to the drain lines D1-D3, the source lines S1-S3, the third signal lines A1-A3 and the fourth signal lines B1-B3. FIG. 6 is an example and the application is not limited by this. The third signal lines A1-A3 are coupled to the nodes A of the memory cells C11-C33; and the fourth signal lines B1-B3 are coupled to the nodes B of the memory cells C11-C33. The memory cells C11-C33 are implemented by the memory cell 100 of FIG. 1.

In programming operations and read operations, the selected drain line(s), the selected source line(s), the selected third signal line(s), and the selected fourth signal line(s), coupled to the selected memory cell(s) are biased as discussed above. The unselected drain line(s), the unselected source line(s), the unselected third signal line(s), and the unselected fourth signal line(s), coupled to the unselected memory cell(s) are floated to prevent current leakage or disturbance.

For example, if the memory cell C22 are selected for programming operations or read operations, the selected drain line D2, the selected source line S2, the selected third signal line A2, and the selected fourth signal line B2 are biased as discussed above.

Figure 7A:
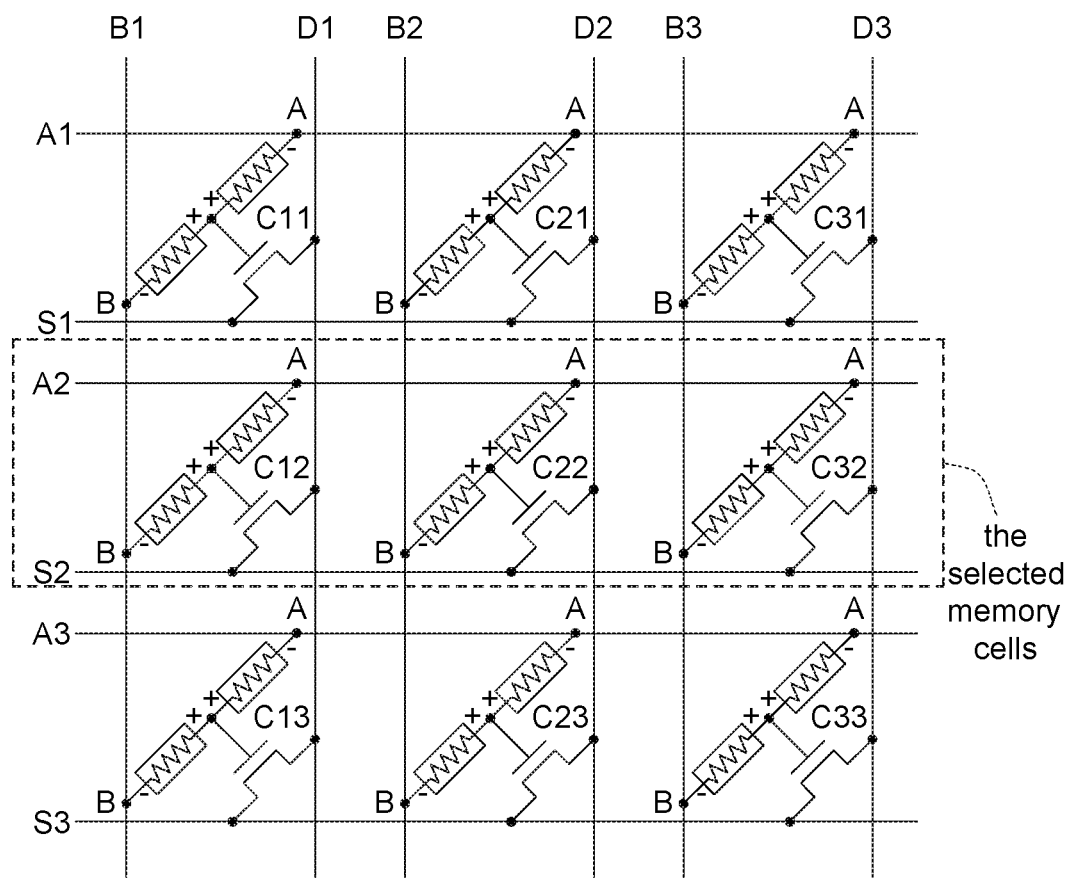
FIG. 7A shows multiple cell parallel read operation in row direction according to one embodiment of the application.

FIG. 7A shows multiple cell parallel read operation in row direction according to one embodiment of the application. As shown in FIG. 7A, if the memory cells C12, C22 and C32 on the second row are to be read, then the drain lines D1-D3, the source line S2, the third signal line A2 and the fourth signal lines B1-B3 are biased as above. In reading, the memory states of each of the selected memory cells C12, C22 and C32 are read out from the respective drain lines D1-D3.

Figure 7B:
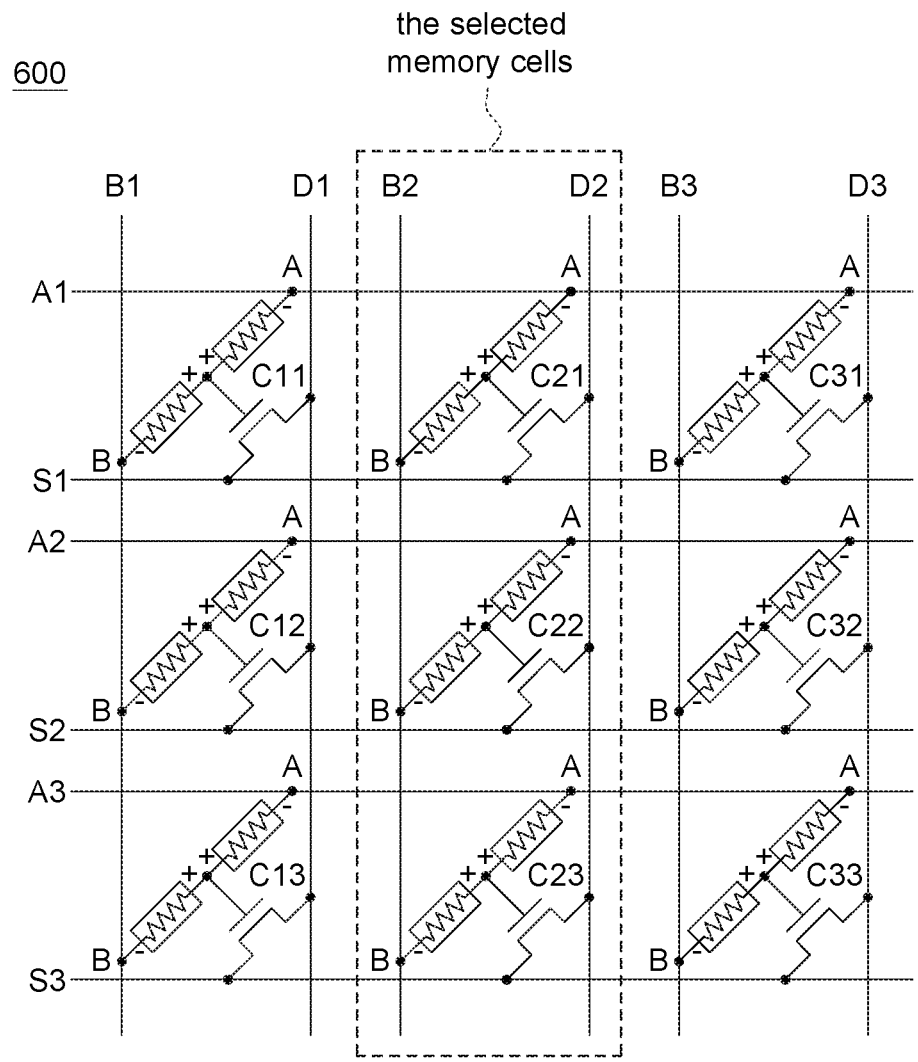
FIG. 7B shows multiple cell parallel read operation in column direction according to one embodiment of the application.

FIG. 7B shows multiple cell parallel read operation in column direction according to one embodiment of the application. As shown in FIG. 7B, if the memory cells C21, C22 and C23 on the second column are to be read, then the drain line D2, the source lines S1-S3, the third signal lines A1-A3 and the fourth signal line B2 are biased as above. In reading, the memory states of each of the selected memory cells C21, C22 and C23 are read out from the respective source lines S1-S3.

Figure 7C:
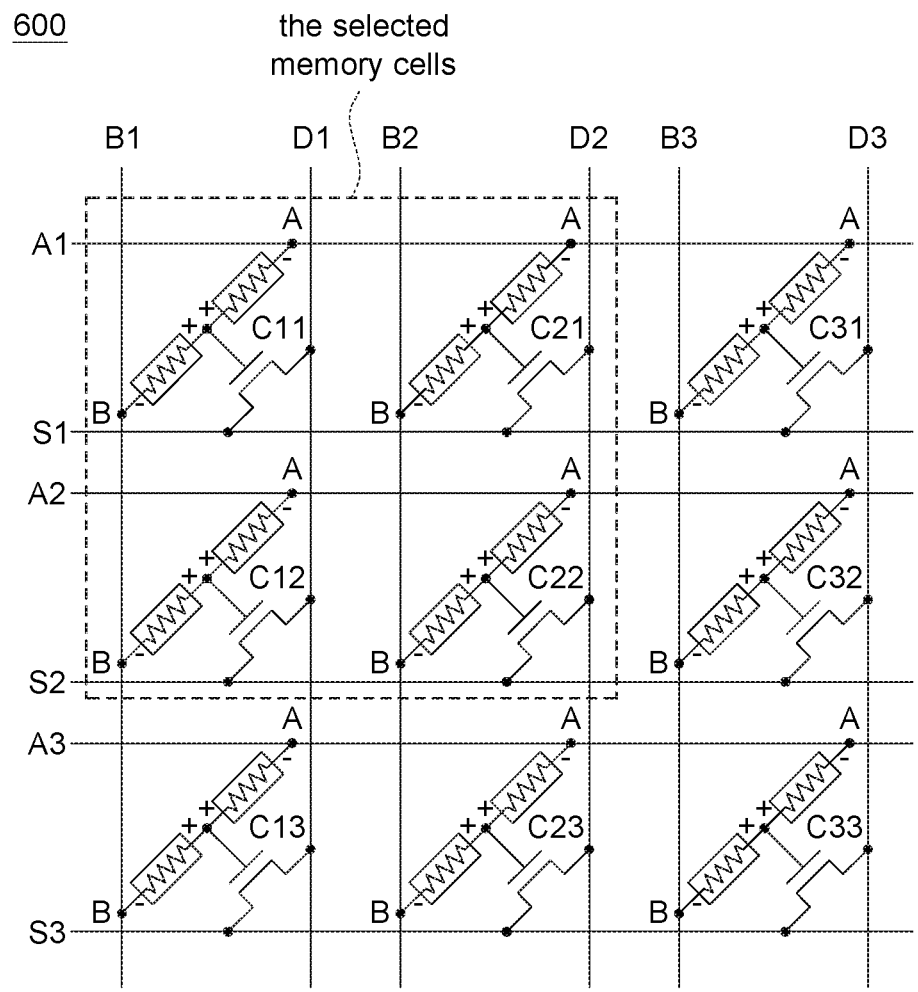
FIG. 7C shows multiple-row-multiple-column parallel read operation according to one embodiment of the application.

FIG. 7C shows multiple-row-multiple-column parallel read operation according to one embodiment of the application. Under this mode, the current summation of the selected memory cells is available. For example, if the memory cells C11, C21, C12 and C22 are read at the same time, the drain lines D1-D2, the source lines S1-S2, the third signal lines A1-A2 and the fourth signal lines B1-B2 are biased as above. The current read from the source line S1 is the current summation of the read current from the memory cells C11 and C21; the current read from the source line S2 is the current summation of the read current from the memory cells C12 and C22. Also, the current read from the drain line D1 is the current summation of the read current from the memory cells C11 and C12; the current read from the drain line D2 is the current summation of the read current from the memory cells C21 and C22. For the read mode shown in FIG. 70, the current summation is available. The read operation in FIG. 7C may be suitable for special application, such as the computing-in-memory sum-of-product for neural networks.

Figure 8:
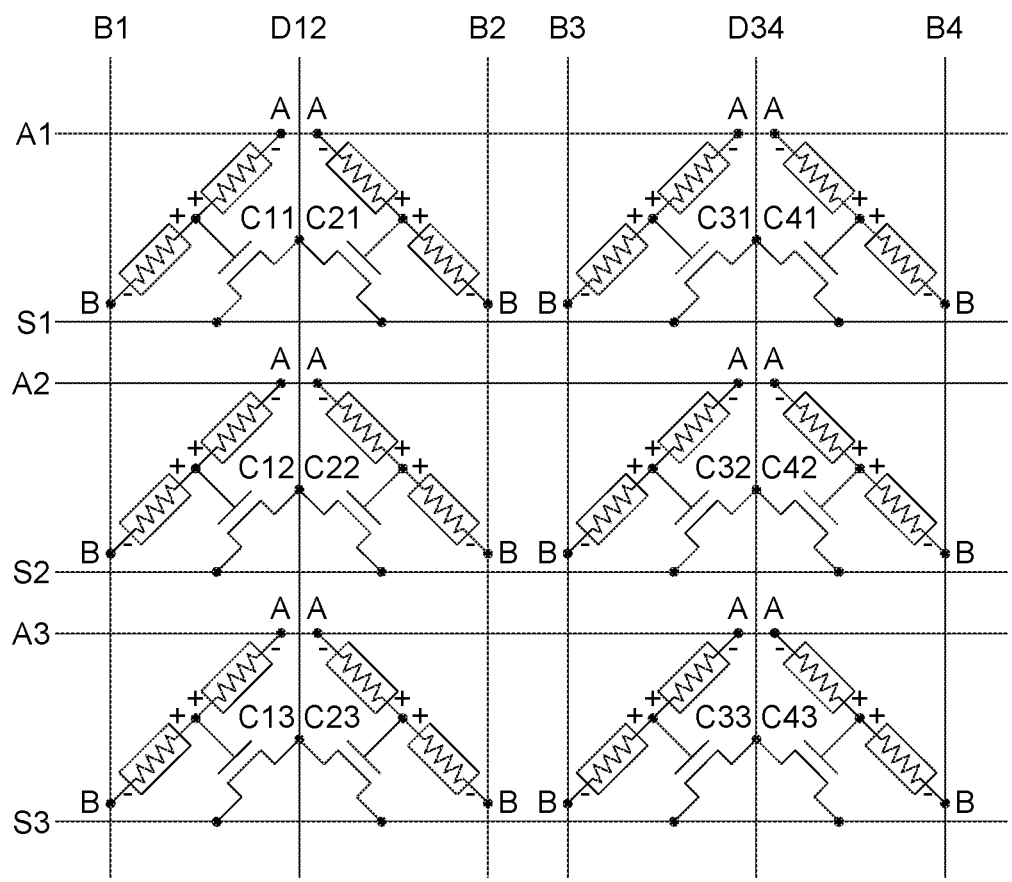
FIG. 8 shows a structure diagram for a memory array for sharing drain lines according to one embodiment of the application.
Figure 9:
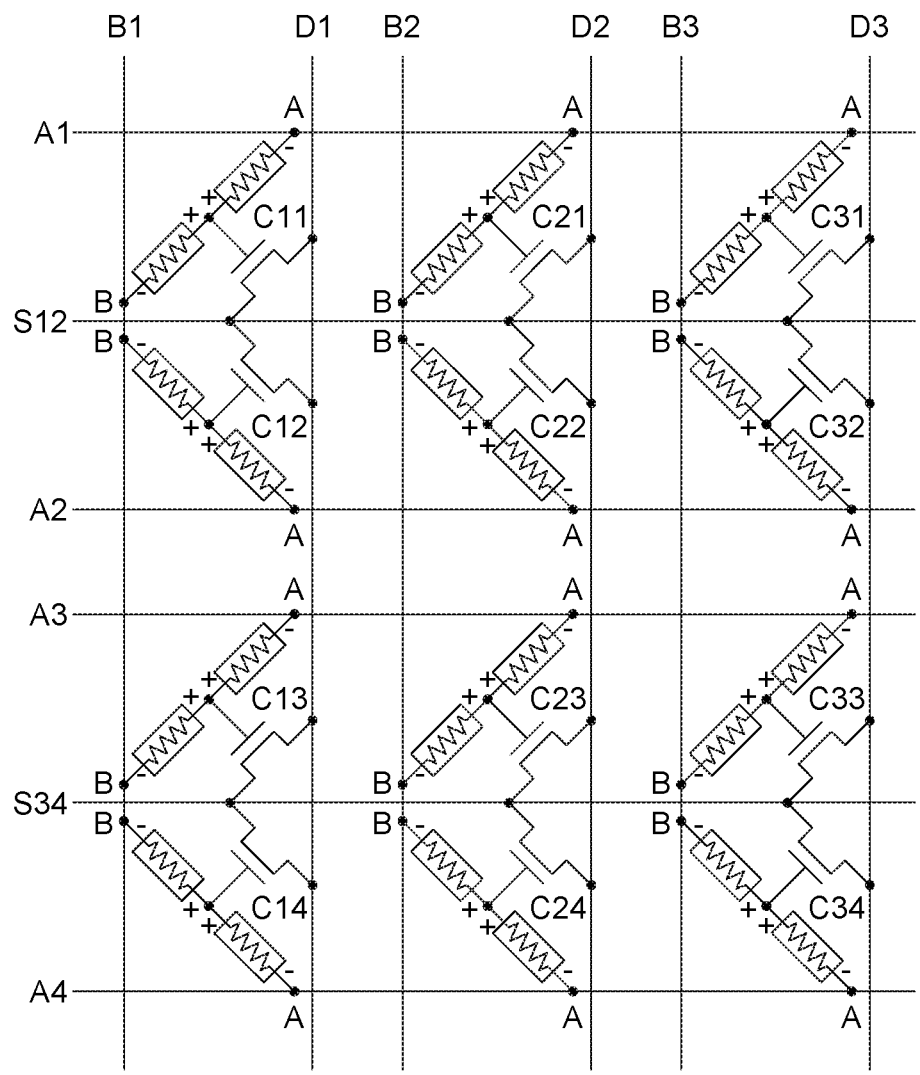
FIG. 9 shows a structure diagram for a memory array for sharing source lines according to one embodiment of the application.

Other possible embodiments of the application provide the simplified memory array structure. FIG. 8 shows a structure diagram for a memory array 800 for sharing drain lines according to one embodiment of the application, wherein the drain line D12 is shared by the multiple memory cells C11, C12, C13, C21, C22 and C23 (i.e. a first memory cell group); and the drain line D34 is shared by the multiple memory cells C31, C32, C33, C41, C42 and C43. FIG. 9 shows a structure diagram for a memory array for sharing source lines according to one embodiment of the application, wherein the source line S12 is shared by the multiple memory cells C11, C21, C31, C12, C22 and C32 (i.e. a second memory cell group); and the source line S34 is shared by the multiple memory cells C13, C23, C33, C14, C24 and C34. Of course, in other possible embodiment of the application, there are more implementations for sharing the drain lines and/or the source lines, which are still within the spirit and the scope of the application. The read operations and programming operations of FIG. 8 and FIG. 9 are similar to those of the above embodiments and thus details are omitted.

In embodiments of the application, the two resistance elements of the memory cell are programmed complementarily, that is, one of the two resistance elements is programmed as high impedance state while the other of the two resistance elements is programmed as low impedance state. Combination of the two resistance elements is used to indicate the memory state of the memory cell. For example, the combination of the two resistance elements may be binary H-L or L-H). Alternatively, the combination of the two resistance elements may be multi-level (chosen from R1, R2, R3 and R4, wherein R1-R4 refers to the resistance values of the resistance elements). Alternatively, the combination of the two resistance elements may be analog numbers (chosen from any value between highest and lowest value).

The node voltage VC is defined based on the voltage division by the two resistance elements.

The output current of the transistor is controlled by the gate voltage of the transistor (i.e. the node voltage VC of the two resistance elements). The node voltage VC of the two resistance elements can be designed to operate at different regions (the linear region or the log scale region). Also, the memory cells of one embodiment of the application may be used to implement a true random number generator (TRNG) or a physically unclonable function (PUF).

Embodiments of the application have at least the following advantages. The output current distribution of the memory cell is improved. The output memory window is improved to effectively determine whether the readout value is logic 1 or logic 0.

The memory cells in embodiments of the application may be bipolar resistance change memory cells or bipolar capacitance change memory cells or other two-terminal memory cells. The bipolar resistance change memory cells include: Oxide ReRAM (Resistive random-access memory) cells, conduction bridge ReRAM cells, Magnetic Random Access Memory (MRAM) cells. The bipolar capacitance change memory cells include: Ferroelectric RAM (FeRAM) memory cells.

The memory cells in the embodiments of the application may be programmed in binary, multilevel or analog value (continuous value).

In embodiments of the application, the node voltage of the center node of the first resistance element RR and the second resistance element LR are used to control the gate voltage of the transistor, and thus the difference of the two resistance elements is amplified to the transistor current for better signal quality and reliability. The improved signal quality refers to for example but not limited by, a better current level, a better stability and a larger window between different memory logic states, which may affect the readout speed. The improved signal reliability refers to for example but not limited by, better noise immunity, or better data retention, which may affect the correctness of the output data.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A memory cell comprising:
a transistor having a control terminal coupled to a first node; a first terminal coupled to a first signal line; and a second terminal coupled to a second signal line;
a first resistance element, having a first terminal coupled to the first node and a second terminal coupled to a second node; and
a second resistance element, having a first terminal coupled to the first node and a second terminal coupled to a third node;
wherein positive terminals of the first resistance element and the second resistance element are coupled to each other at the first node.

2. The memory cell according to claim 1, wherein the first terminal of the first resistance element is a first positive terminal, the second terminal of the first resistance element is a first negative terminal, the first terminal of the second resistance element is a second positive terminal, and the second terminal of the second resistance element is a second negative terminal.

3. An operation method for a memory cell of claim 1, the operation method including:
   in programming operations, flowing a programming current between the second node and the third node to program one of the first resistance element and the second resistance element at a first impedance state and to program the other of the first resistance element and the second resistance element at a second impedance state; and
   in reading operations, applying a voltage across the first resistance element and the second resistance element to flow a read current on the first resistance element and the second resistance element, wherein a first node voltage of the first node is determined based on a resistance ratio of the first resistance element and the second resistance element.

4. The operation method according to claim 3, wherein in programming the memory cell as logic 0, the second node is applied by a first programming voltage, the third node is applied by a second programming voltage lower than the first programming voltage, the first resistance element is programmed to the first impedance state, the second resistance element is programmed to the second impedance state, and the first node and the second node of the transistor is floated.

5. The operation method according to claim 3, wherein in programming the memory cell as logic 1, the second node is applied by a third programming voltage, the third node is applied by a fourth programming voltage higher than the third programming voltage, the second resistance element is programmed to the first impedance state, the first resistance element is programmed to the second impedance state, and the first node and the second node of the transistor is floated.

6. The operation method according to claim 3, wherein
   in reading the memory cell, the second node is applied by a first read voltage and the third node is applied by a second read voltage, the first read voltage and the second read voltage are both lower than a threshold voltage.

7. The operation method according to claim 3, wherein
   in reading the memory cell, the second node is applied by a first read voltage and the third node is applied by a second read voltage, the first read voltage is higher than a threshold voltage and the second read voltage is lower than the threshold voltage.

8. The operation method according to claim 3, wherein
   in reading the memory cell, the second node is applied by a first read voltage and the third node is applied by a second read voltage, the first read voltage and the second read voltage are both higher than a threshold voltage.

9. A memory array comprising:
   a plurality of memory cells;
   a plurality of first signal lines;
   a plurality of second signal lines;
   a plurality of third signal lines; and
   a plurality of fourth signal lines,
   wherein the memory cells are coupled to the first signal lines, the second signal lines, the third signal lines and the fourth signal lines,
   each of the memory cells includes:
   a transistor having a control terminal coupled to a first node; a first terminal coupled to one of the first signal lines; and a second terminal coupled to one of the second signal lines;
   a first resistance element, having a first terminal coupled to the first node and a second terminal coupled to a second node; and
   a second resistance element, having a first terminal coupled to the first node and a second terminal coupled to a third node;
   wherein positive terminals of the first resistance element and the second resistance element are coupled to each other at the first node.

10. The memory array according to claim 9, wherein in programming operations and read operations, at least one selected first signal line of the first signal lines, at least one selected second signal line of the second signal lines, at least one selected third signal line of the third signal lines, at least one selected fourth signal line of the fourth signal lines, coupled to at least one selected memory cell of the memory cells, are applied by a plurality of bias voltages; and at least one unselected first signal line of the first signal lines, at least one unselected second signal line of the second signal lines, at least one unselected third signal line of the third signal lines, at least one unselected fourth signal line of the fourth signal lines, coupled to at least one unselected memory cell of the memory cells, are floated.

11. The memory array according to claim 9, wherein at least one first signal line of the first signal lines is shared by a first memory cell group of the memory cells.

12. The memory array according to claim 9, wherein at least one second signal line of the second signal lines is shared by a second memory cell group of the memory cells.

13. The memory array according to claim 9, wherein the first terminal of the first resistance element is a first positive terminal, the second terminal of the first resistance element is a first negative terminal, the first terminal of the second resistance element is a second positive terminal, and the second terminal of the second resistance element is a second negative terminal.

* * * * *